(12) United States Patent
Cao

(10) Patent No.: US 9,716,954 B2
(45) Date of Patent: Jul. 25, 2017

(54) DC IMPEDANCE DETECTION CIRCUIT AND METHOD FOR SPEAKER

(71) Applicant: Silergy Semiconductor Technology (Hangzhou) LTD, Hangzhou, ZheJiang Province (CN)

(72) Inventor: Hejinsheng Cao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 20 days.

(21) Appl. No.: 14/997,699

(22) Filed: Jan. 18, 2016

(65) Prior Publication Data

US 2016/0212556 A1    Jul. 21, 2016

(30) Foreign Application Priority Data

Jan. 19, 2015  (CN) .......................... 2015 1 0025308
Nov. 30, 2015  (CN) .......................... 2015 1 0863596

(51) Int. Cl.
| H04R 29/00 | (2006.01) |
| H03F 3/183 | (2006.01) |
| G01R 19/00 | (2006.01) |
| H03F 3/217 | (2006.01) |

(52) U.S. Cl.
CPC ....... *H04R 29/001* (2013.01); *G01R 19/0023* (2013.01); *H03F 3/183* (2013.01); *H03F 3/2173* (2013.01); *H03F 2200/03* (2013.01)

(58) Field of Classification Search
CPC ... H04R 29/001; H04R 19/0023; H03F 3/183; H03F 3/2173; H03F 2200/03
USPC ............................................ 381/59, 55, 120
See application file for complete search history.

(56) References Cited

U.S. PATENT DOCUMENTS

| 7,005,865 B2 | 2/2006 | Yakabe et al. | |
| 8,525,529 B2 | 9/2013 | Ishizeki et al. | |
| 2005/0083116 A1* | 4/2005 | Risbo | H03F 3/217 330/10 |
| 2012/0020488 A1* | 1/2012 | Huijser | H04R 3/007 381/59 |

* cited by examiner

*Primary Examiner* — Melur Ramakrishnaiah
(74) *Attorney, Agent, or Firm* — Michael C. Stephens, Jr.

(57) ABSTRACT

A DC impedance detection circuit can include: an integration time generation circuit configured to generate an integration time signal in accordance with a current flowing through a speaker, where the current of a speaker at a beginning time of each active time interval of the integration time signal is the same as that at an ending time of the active time interval; a current integration circuit configured to integrate the current of the speaker in the active time interval, and to generate a current integration signal; a voltage integration circuit configured to integrate a voltage of the speaker in the active time interval, and to generate a voltage integration signal; and where a ratio between the voltage integration signal and the current integration signal is configured as a DC impedance of the speaker in the active time interval.

16 Claims, 7 Drawing Sheets

DC IMPEDANCE DETECTION CIRCUIT AND METHOD FOR SPEAKER

RELATED APPLICATIONS

This application claims the benefit of Chinese Patent Application No. 201510025308.6, filed on Jan. 19, 2015, and to Chinese Patent Application No. 201510863596.2, filed on Nov. 30, 2015, both of which are incorporated herein by reference in their entirety.

FIELD OF THE INVENTION

The present disclosure generally relates to the field of power electronics, and more particularly, to DC impedance detection methods and circuits.

BACKGROUND

Quality requirements continued to increase in the speaker industry, and accurate measurement of the performance parameters is becoming increasingly important. Important parameters needing accurate measurement include the frequency response curve, and the impedance curve of the speaker. For example, a class D audio amplifier can be designed to drive the speaker in accordance with specific parameters of the speaker obtained according to the impedance curve of the speaker.

SUMMARY

In one embodiment, a method of detecting a DC impedance of a speaker, can include: (i) generating a current integration signal by integrating a current of the speaker in an integration time interval; (ii) generating a voltage integration signal by integrating a voltage of the speaker in the integration time interval; (iii) generating a DC impedance of the speaker in the integration time interval by calculating a ratio between the voltage integration signal and the current integration signal; and (iv) the integration time interval being a time interval during operation of the speaker, where the current of the speaker at a beginning time of the integration time interval is the same as that at an ending time of the integration time interval.

In one embodiment, a DC impedance detection circuit can include: (i) an integration time generation circuit configured to generate an integration time signal in accordance with a current flowing through a speaker, where the current of a speaker at a beginning time of each active time interval of the integration time signal is the same as that at an ending time of the active time interval; (ii) a current integration circuit configured to integrate the current of the speaker in the active time interval, and to generate a current integration signal; (iii) a voltage integration circuit configured to integrate a voltage of the speaker in the active time interval, and to generate a voltage integration signal; and (iv) where a ratio between the voltage integration signal and the current integration signal is configured as a DC impedance of the speaker in the active time interval.

DETAILED DESCRIPTION

Figure 1:
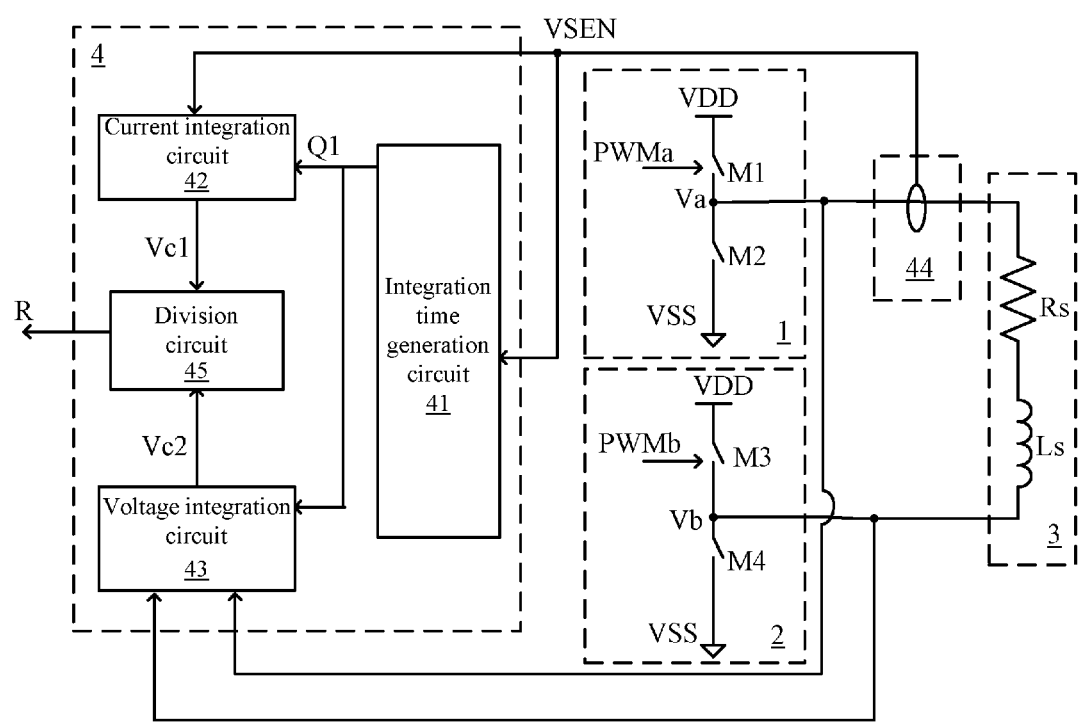
FIG. 1 is a schematic block diagram of an example class D audio amplifier, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In some cases, the DC impedance of the speaker can be detected in an offline mode. When the speaker is out of operation, a specific current may be applied to the speaker, and by detecting a voltage across the two terminals of the speaker, the DC impedance can be obtained. When the speaker is out of operation, the DC impedance remains constant. However, while in operation, the DC impedance can vary with the temperature and other factors. Because the DC impedance may not be detected in real time by using such an offline detection approach, the DC impedance during operation may not accurately be detected, and as a result may produce relatively large errors.

In one embodiment, a method of detecting a DC impedance of a speaker, can include: (i) generating a current integration signal by integrating a current of the speaker in an integration time interval; (ii) generating a voltage integration signal by integrating a voltage of the speaker in the integration time interval; (iii) generating a DC impedance of the speaker in the integration time interval by calculating a ratio between the voltage integration signal and the current integration signal; and (iv) the integration time interval being a time interval during operation of the speaker, where the current of the speaker at a beginning time of the integration time interval is the same as that at an ending time of the integration time interval.

In one embodiment, a DC impedance detection circuit can include: (i) an integration time generation circuit configured to generate an integration time signal in accordance with a current flowing through a speaker, where the current of a speaker at a beginning time of each active time interval of the integration time signal is the same as that at an ending time of the active time interval; (ii) a current integration circuit configured to integrate the current of the speaker in the active time interval, and to generate a current integration signal; (iii) a voltage integration circuit configured to integrate a voltage of the speaker in the active time interval, and to generate a voltage integration signal; and (iv) where a ratio between the voltage integration signal and the current integration signal is configured as a DC impedance of the speaker in the active time interval.

Referring now to FIG. 1, shown is a schematic block diagram of an example class D audio amplifier, in accordance with embodiments of the present invention. The example class D audio amplifier can drive speaker 3, which may be equivalent to a circuit including resistor Rs and inductor Ls connected in series. The class D audio amplifier can include half bridge switching circuits 1 and 2 to provide voltages Va and Vb to the two terminals of speaker 3, as supply voltage for speaker 3. Half bridge switching circuit 1 can include switching transistors M1 and M2 connected in series between supply voltage VDD and reference ground VSS. Also, the voltage at the common node of switching transistors M1 and M2 may be configured as voltage Va to a first terminal of speaker 3 (e.g., one terminal of resistor Rs). Half bridge switching circuit 2 can include switching transistors M3 and M4 connected in series between supply voltage VDD and reference ground VSS.

The voltage at the common node of switching transistors M3 and M4 can be configured as voltage Vb to a second terminal of speaker 3 (e.g., one terminal of inductor Ls). The difference voltage between voltages Va and Vb can be configured as the supply voltage of speaker 3, that is the sum voltage across resistor Rs and inductor Ls. The status of switching transistors M1 and M2 may be complementary, and controlled by control signal PWMa. The status of switching transistors M3 and M4 may be complementary, and controlled by control signal PWMb. The switching period of control signal PWMa can be the same as that of control signal PWMb; therefore, the switching periods of half bridge switching circuits 1 and 2 can be the same. Both of control signals PWMa and PWMb can be pulse-width modulation (PWM) signals generated by a modulator of the class D audio amplifier.

As shown in FIG. 1, the class D audio amplifier may also include DC impedance detection circuit 4 for speaker 3. DC impedance detection circuit 4 can include integration time generation circuit 41, current integration circuit 42, and voltage integration circuit 43. In addition, current sampling circuit 44 and division circuit 45 can be included in some cases. Integration time generation circuit 41 can generate integration time signal Q1 in accordance with the current flowing through speaker 3. Also, current at the starting time of each active time interval of integration time signal Q1 can be the same as that at the ending time.

Figure 2A:
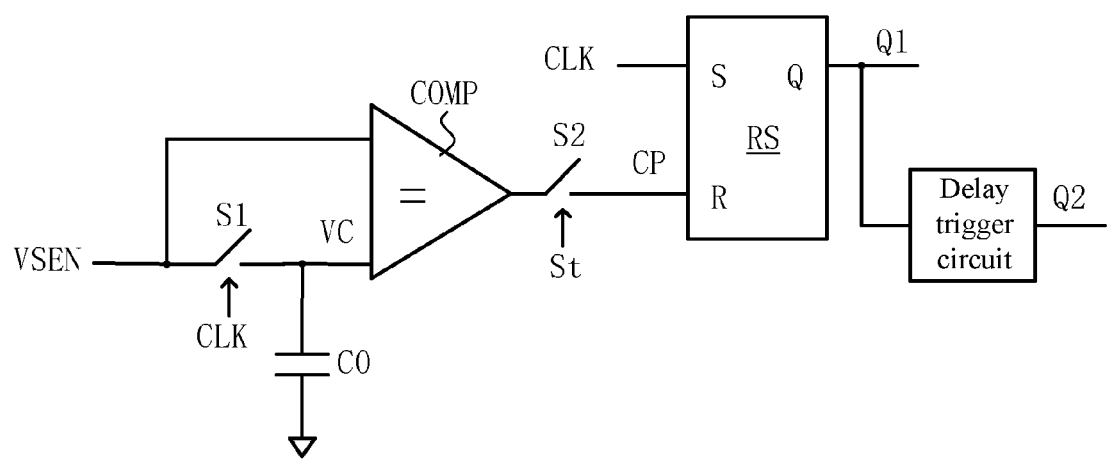
FIG. 2A is a schematic block diagram of an example integration time generation circuit, in accordance with embodiments of the present invention.

Referring now to FIG. 2A, shown is a schematic block diagram of an example integration time generation circuit, in accordance with embodiments of the present invention. In this particular example, integration time generation circuit 41 can include RS flip flop RS, identity comparator COMP, sampling capacitor C0, sampling switch S1, and shielding switch S2. The set terminal of RS flip flop RS can receive clock signal CLK to determine when integration time signal Q1 is activated.

Figure 3:
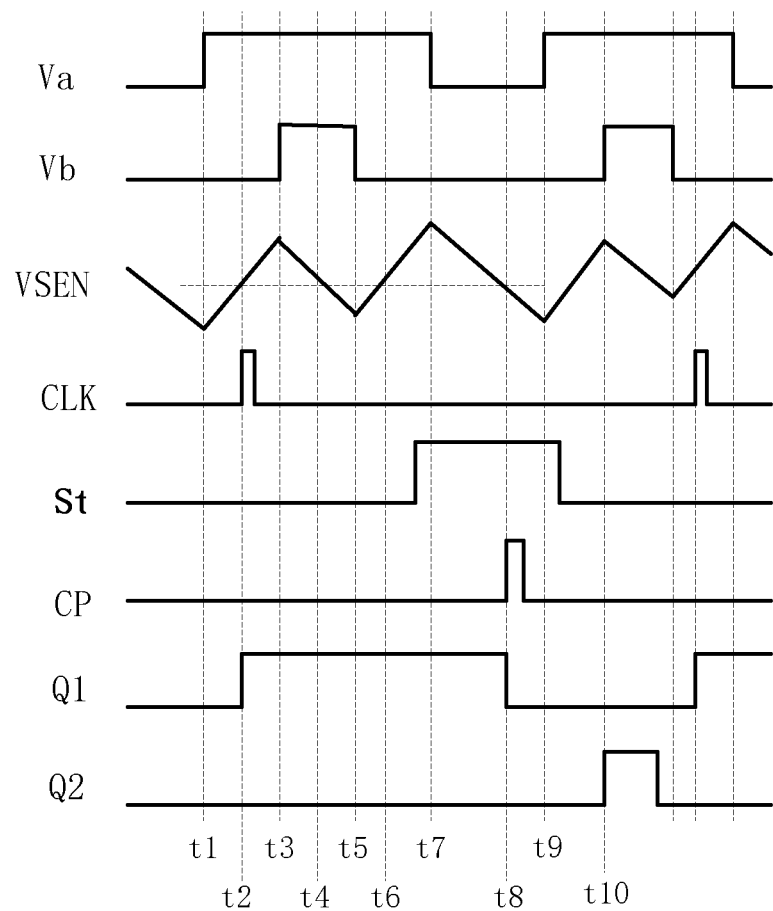
FIG. 3 is a waveform diagram of example operation of a DC impedance detection circuit for a speaker, in accordance with embodiments of the present invention.

Referring also to FIG. 3, shown is a waveform diagram of example operation of a DC impedance detection circuit for a speaker, in accordance with embodiments of the present invention. When clock signal CLK is activated (e.g., goes high at time t2), integration time signal Q1 generated by RS flip flop RS can go active. The reset terminal of RS flip flop RS can receive output signal CP generated by identity comparator COMP. When signal CP is activated (e.g., goes high), integration time signal Q1 can go inactive (e.g., low). Therefore, the starting time of each active time interval of integration time signal Q1 may be determined by clock signal CLK, and the ending time can be determined by signal CP.

Identity comparator COMP may effectively obtain two times/moments at which the current of speaker 3 is the same, and may generate output signal CP. When the signals at the two input terminals of identity compactor COMP are the same, signal CP can be activated. A first input terminal of identity comparator COMP can receive sampling signal VSEN that represents the current of speaker 3, and a second input terminal can receive a specific voltage that equals sampling signal VSEN when clock signal CLK is active. For example, sampling switch S1 can connect between sampling signal VSEN and the second input terminal, and sampling capacitor C0 can connect between the second input terminal and ground.

The on and off states of sampling switch S1 may be controlled directly by clock signal CLK, or by other signals synchronous with clock signal CLK. When clock signal CLK is active, sampling switch S1 can be turned on; therefore, the voltage across sampling capacitor C0 can receive sampling signal VSEN. Because the active pulse width of clock signal CLK may be relatively small, when sampling switch S1 is turned off, the voltage across sampling capacitor C0 can be maintained. When the signals at two input terminals of identity comparator COMP are the same, output signal CP can go active, and integration time signal Q1 can go inactive. In this way, a time at which the current of speaker 3 matches that at another time as determined by clock signal CLK can be determined. Therefore, the starting and ending times when integration time signal Q1 is active can correspondingly be determined.

In order to increase the length of each active time interval of integration time interval Q1 in order to improve the impedance detection accuracy, at least one time at which the current of speaker 3 is identical with that at the starting time may be included in each active time interval of integration time signal Q1. For example, integration time generation circuit can also include shielding switch S2 connected between the output terminal of identity comparator COMP and reset terminal of RS flip flop RS. The on and off states of shielding switch S2 can be controlled by switching signal St, in order to shield at least one time at which the current of speaker 3 is identical with that at the starting time such that at least one time at which the current of speaker 3 is identical with that at the starting time can be included in each active time interval of integration time signal Q1.

As shown in FIG. 3, between times t4 and t6, sampling signal VSEN can be the same as that at time t2. Due to control signal St, shielding switch S2 may be turned off to disable the reset terminal of RS flip flop RS. Therefore, integration time signal Q1 may remain high in order to increase the length of the active time interval. When switching signal St is turned on again, and the current of speaker 3 is identical with that at the starting time again (e.g., at time t8), integration time signal Q1 may go inactive.

Referring again to FIG. 2A, integration time generation circuit 4 can also include delay trigger circuit 21 for generating clearing signal Q2 to clear current integration signal Vc1 and voltage integration signal Vc2. After a delay time after integration time signal Q1 goes inactive (e.g., the time interval from time t8 to t10), clearing signal Q1 can go active at t10 to clear current integration signal Vc1 and voltage integration signal Vc2. Before integration time signal Q1 recovers to be active, clearing signal Q2 may go inactive to guarantee that the integration operation in the next cycle. Current integration circuit 42 can integrate the current of speaker 3 during the active time interval of integration time signal Q1, in order to generate current integration signal Vc1.

Figure 2B:
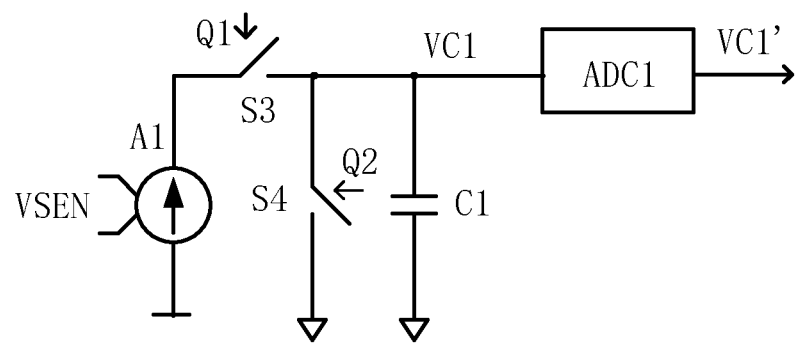
FIG. 2B is a schematic block diagram of an example current integration circuit, in accordance with embodiments of the present invention.

Referring now to FIG. 2B, shown is a schematic block diagram of an example current integration circuit, in accordance with embodiments of the present invention. Current integration circuit 42 can include controllable current source A1, integration control switch S3, clear control switch S4, and integration capacitor C1. The output current of controllable current source A1 may be determined by the current flowing through speaker 3. For example, controllable current source A1 may be a voltage controlled current source controlled by sampling signal VSEN that represents the current flowing through speaker 3.

Integration control switch S3 can connect between the output terminal of controllable current source A1 and a first terminal of integration capacitor C1, and may be controlled by integration time signal Q1. A second terminal of integration capacitor C1 can connect to ground. Clearing control switch S4 can connect in parallel with integration capacitor C1, and may be controlled by clear signal Q2. The signal at the first terminal of integration capacitor C1 can be configured as current integration signal Vc1. Voltage integration circuit 43 can integrate the voltage of speaker 3 during the active time interval of integration time signal Q1, in order to generate voltage integration signal Vc2.

Figure 2C:
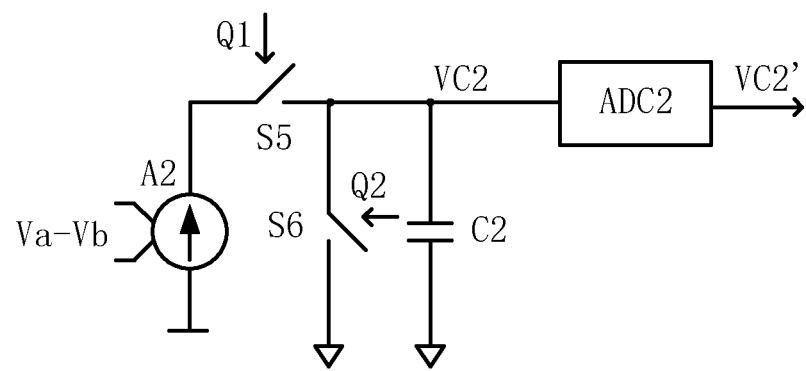
FIG. 2C is a schematic block diagram of an example voltage integration circuit, in accordance with embodiments of the present invention.

Referring now to FIG. 2C, shown is a schematic block diagram of an example voltage integration circuit, in accordance with embodiments of the present invention. Voltage integration circuit 43 can include controllable current source A2, integration control switch S5, clear control switch S6, and integration capacitor C2. The output current of controllable current source A2 may be determined by the current flowing through speaker 3. For example, controllable current source A2 may be a voltage controlled current source controlled by the difference voltage between voltages Va and Vb. Integration control switch S5 can connect between the output terminal of controllable current source A2 and a first terminal of integration capacitor C2, and may be controlled by integration time signal Q1. Also, a second terminal of integration capacitor C2 can connect to ground. Clearing control switch S6 can connect in parallel with integration capacitor C2, and may be controlled by clear signal Q2. Also, the signal at the first terminal of integration capacitor C2 can be configured as voltage integration signal Vc2.

Current integration circuit 42 (see, e.g., FIG. 2B) and voltage integration circuit 43 (see, e.g., FIG. 2C) can also include analog-to-digital converters ADC1 and ADC2 4 converting current integration signal Vc1 and voltage integration signal Vc2 to digital signals Vc1' and Vc2'. When the integration time signal is active, the ratio between the voltage integration signal and the current integration signal can be obtained by division circuit 45, and may be configured as the DC impedance value of speaker 3. The difference voltage between voltage Va of half bridge switching circuit 1 and voltage Vb of half bridge switching circuit 2 can be configured as the voltage of speaker 3. As shown below, item "I" or "i" may represent the current flowing through speaker 3, "R" can represent the resistance of resistor Rs, and "L" may represent the inductance of inductor Ls.

Referring again to FIG. 3, during the time interval from time t2 to time t3:

$$(Va - Vb) - i \cdot R = L \cdot \frac{di}{dt} \quad (1)$$

During the time interval from time t3 to time t5:

$$(Va - Vb) - i \cdot R = L \cdot \frac{di}{dt} \quad (2)$$

During the time interval from time t5 to time t7:

$$(Va - Vb) - i \cdot R = L \cdot \frac{di}{dt} \quad (3)$$

During the time interval from time t7 to time t8:

$$(Va - Vb) - i \cdot R = L \cdot \frac{di}{dt} \quad (4)$$

Because the current of speaker 3 at time t2 may be consistent with that at time t8, the current variation of the current of speaker 3 may be zero at the time interval from time t2 to time t8. Based on the voltage-second balance principle:

$$\int_{t2}^{t3} [(Va - Vb) - i \cdot R] dt + \int_{t3}^{t5} [(Va - Vb) - i \cdot R] dt + \int_{t5}^{t7} [(Va - Vb) - i \cdot R] dt + \int_{t7}^{t8} [(Va - Vb) - i \cdot R] dt = 0 \quad (5)$$

Because the variation of DC impedance R of speaker 3 in one switching period can be omitted, equation (5) can be simplified:

$$R = \frac{\int_{t2}^{t8} (Va - Vb) dt}{\int_{t2}^{t8} i \, dt} \quad (6)$$

From the above analysis, the DC impedance of the speaker can be obtained by calculating the ratio between the integration value of the voltage and the current of the speaker between two times at which the current is equal. As shown in FIG. 1, DC impedance detection circuit 4 can also include current sampling circuit 44 for generating sampling signal VSEN that represents the current of speaker 3. As shown in FIG. 1, DC impedance detection circuit 4 can also include division circuit 45 for calculating the ratio between voltage integration signal Vc2 and current integration signal Vc1, in order to obtain the DC impedance of speaker 3. In some cases, such as when analog-to-digital converters ADC1 and ADC2 are employed to convert current integration signal Vc1 and voltage integration signal Vc2 to digital signals Vc1' and Vc2', division circuit 45 can be omitted.

The DC impedance of speaker 3 can be obtained directly through a digital controller, in order to achieve an analog and digital mixed control mode. In accordance with the DC impedance detection circuit of the above example, during a time interval in which the current variation of the speaker is zero, the current and voltage of the speaker may be separately integrated in order to generate the current and voltage integration signals. The ratio between the voltage integration signal and the current integration signal may be calculated to be the DC impedance. In this way, the DC impedance can be detected in real time during speaker operation to improve the accuracy thereof.

A DC impedance detection method for a speaker driven by a class D audio amplifier can include two half bridge switching circuits that provide a driving voltage to the speaker. The DC impedance detection method can include, in each integration time interval, both the voltage and current of the speaker being integrated to generate a voltage integration signal and a current integration signal. The ratio between the voltage integration signal and the current integration signal can be determined and configured as the DC impedance of the speaker. For example, the current at the beginning time can be the same as that at the ending time of each integration time interval. Moreover, there may be at least one time in each integration time interval at which the current of the speaker is also the same as that at the beginning time.

During a time interval in which the current variation of the speaker is zero, the current and voltage of the speaker can be separately integrated to generate the current and voltage integration signals. The ratio between the voltage integration signal and the current integration signal can be calculated to be configured as the DC impedance. In this way, the DC impedance can be detected in real time during the operation to improve the accuracy. The integration calculation of the voltage and current of the speaker in the integration time interval can be achieved by analog circuits, or analog and digital mixed circuits. Each integration time interval can include multiple switching periods of the class D audio amplifier (e.g., the switching period of half bridge switching circuits).

In each switching period of each integration time interval (e.g., from time t1 to time t9), an average of the current at beginning time of the current switching period and the current at the ending time may be multiplied with the switching period, in order to obtain a current time parameter of the current switching period. Current time parameters of all switching periods can be summed to generate the current integration signal. For example, if there are N switching periods in one integration time interval, the length of the integration time interval may be greater than the period of the audio signal of class D audio amplifier. As shown below, item "I(n)" may represent the current of the speaker at the beginning time of the nth switching period, item "I(n+1)" may represent the current of the speaker at the beginning time of the (n+1)th switching period, and item "Tpwm" may represent the switching period; therefore, current time parameter TI can be represented as:

$$\frac{I(n) + I(n+1)}{2} \times Tpwm \quad (7)$$

Assuming that item "TI(j)" represents the current time parameter of the $j^{th}$ switching period in one integration time interval, the current integration signal should be:

$$\sum_{j=1}^{j=N} TI(j) \quad (8)$$

In each switching period of each integration time interval, the voltage difference can be multiplied with time intervals T1, T2, and T3, in order to generate voltage time parameters TU1, TU2, and TU3. Then, voltage time parameters TU1, TU2, and TU3 can be summed to generate voltage time parameter TU of the current switching period, TU=TU1+TU2+TU3. For example, in time interval T1, voltage Va may be greater than voltage Vb (e.g., time interval from time t1 to time t3, and time t5 to time t7 of FIG. 3).

In time interval T2, voltage Va may be the same as voltage Vb (e.g., time interval from time t3 to time t5, and time t7 to time t9. In time interval T3, voltage Va may be less than voltage Vb. In FIG. 3, the length of time interval T3 can be zero in the current switching period, while in other switching periods, the length of time interval T3 may be greater than zero. When the duty cycle of switching control signals PWMa and PWMb is determined, the length of time intervals T1, T2, and T3 may correspondingly be determined. Each voltage time parameter of each of the switching periods in each integration time interval can be summed, in order to generate the voltage integration signal. Assuming that item "TU(j)" represents the voltage time parameter of the $j^{th}$ switching period in one integration time interval, the current integration signal should be:

$$\sum_{j=1}^{j=N} TU(j) \quad (9)$$

When the integration operation to the current and voltage of the speaker and the division operation are implemented in a digital approach, the DC impedance of the speaker can be accurately obtained, in order to simplify system control. In certain embodiments, switching transistors or switches can be metal oxide field effect transistors (MOSFETs), triodes, or any other suitable devices having switching characteristics.

Figure 4:
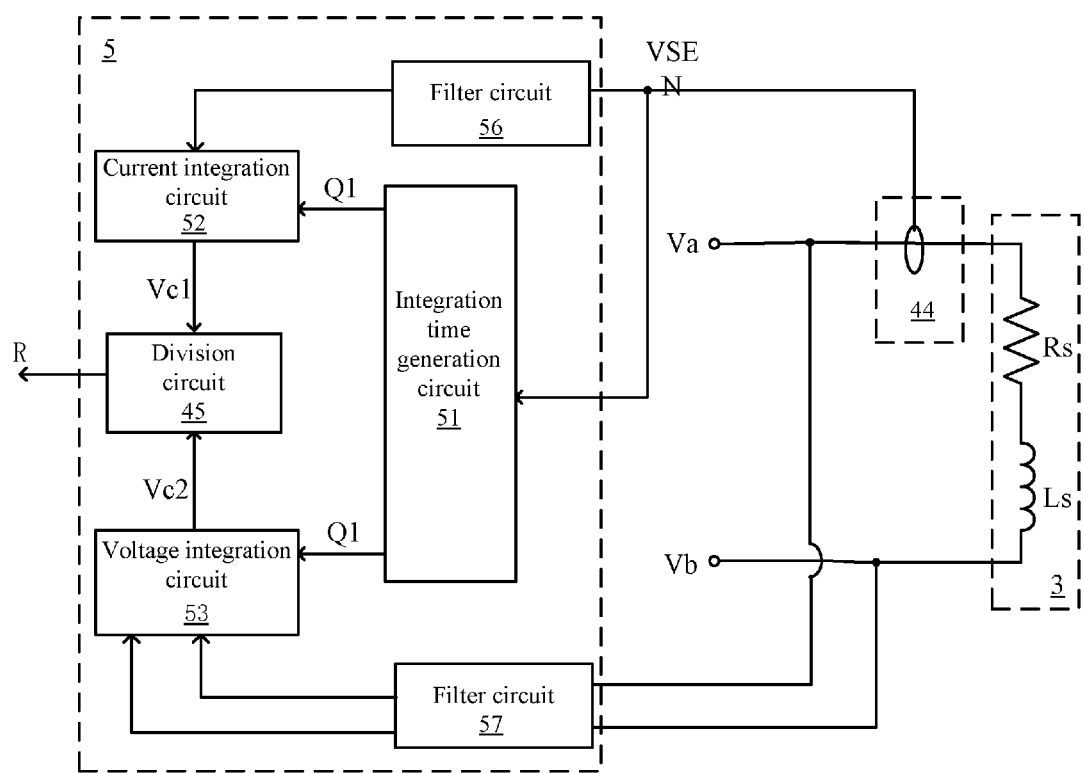
FIG. 4 is a schematic block diagram of an example class D audio amplifier, in accordance with embodiments of the present invention.

Referring now to FIG. 4, shown is a schematic block diagram of an example class D audio amplifier, in accordance with embodiments of the present invention. For example, impedance detection circuit 5 can include integration time generation circuit 51, current integration circuit 52, voltage integration circuit 53, division circuit 45, filter circuit 56, filter circuit 57, and current sampling circuit 44. According to this example, DC impedance detection circuit 5 can be applied to class A, B, and D audio amplifiers. A modulation circuit can also be included in the class D audio amplifier, in order to compare original audio signal against a triangular waveform to generate high frequency PWM control signals. Because the frequency of the input audio signal is lower for class A and B audio amplifiers, filter circuits can be employed to eliminate low-frequency side effects.

Figure 5:
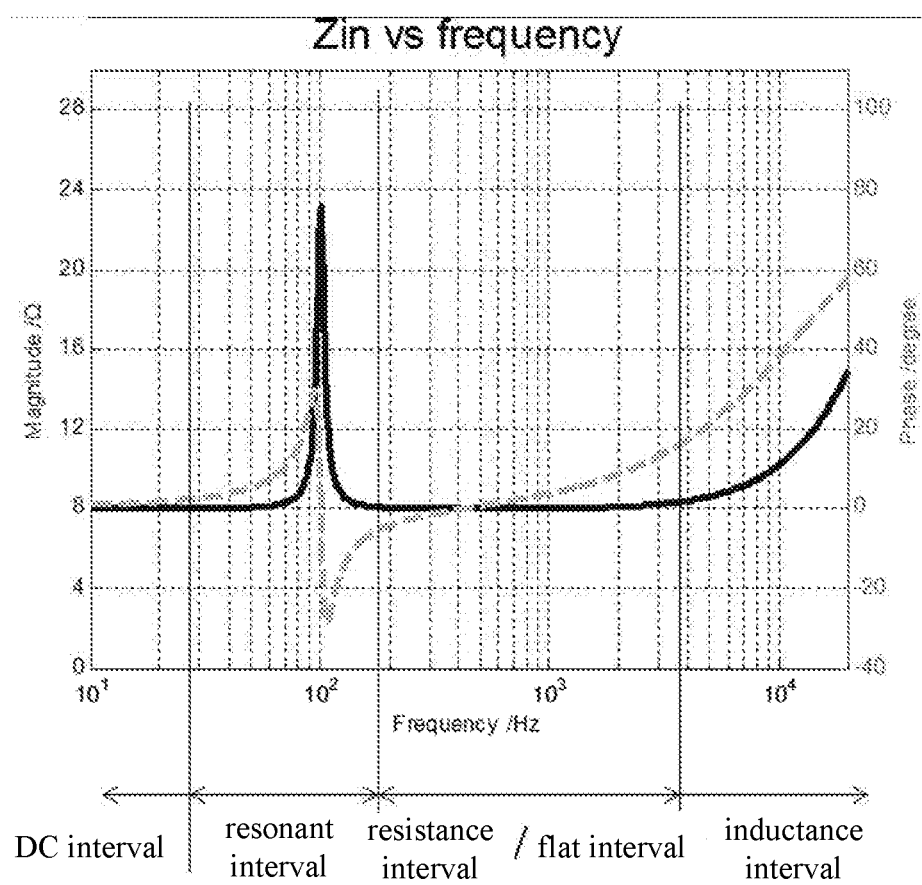
FIG. 5 is a diagram of an example impedance curve of speaker, in accordance with embodiments of the present invention.

Referring now to FIG. 5, shown is a diagram of an example impedance curve of speaker, in accordance with embodiments of the present invention. The darker curve may represent an amplitude variation of the DC impedance of speaker with the operation frequency, and the lighter curve can represent a phase angle variation of the DC impedance of speaker with the operation frequency. It is known that the frequency of an audio signal is in the range of 20 Hz-20 kHz, and the switching frequency may range up to hundreds of kilohertz, and over. Accordingly, the impedance of the speaker can be much steadier when the operation frequency is between 10 Hz and 70 Hz. When the frequency is about 100 Hz, due to the resonance of parasitic parameters, the amplitude of the impedance may substantially increase. Therefore, there can be a spike pulse of greater amplitude in the amplitude curve. When the frequency is greater than 100 Hz, the amplitude of the impedance of the speaker is shown to be stabilizing. Therefore, in order to obtain accurate DC impedance, the DC impedance detection should not be implemented during the resonant time interval.

Referring back to FIG. 4, integration time generation circuit 51 can generate integration time signal Q1 in accordance with the current of speaker 3. The current of speaker at the beginning time of the active time interval of integration time signal Q1 may be the same as that at the ending time of the active time interval of integration time signal Q1. When applied in a class D audio amplifier, integration time generation circuit 51 can be substantially the same as that of the above example of FIG. 2A.

In order to generate integration time signal Q1, the current of speaker 3 at a beginning time can be obtained. After a delay time has elapsed, the current of speaker 3 can be detected (e.g., by current sampling circuit 44) in real time until the current of speaker is the same as that at the beginning time, the time of which can be configured as the ending time of the integration time interval. In order to avoid detecting a time at which the current is the same as that at the beginning time based on a ripple current of the switching frequency, the delay time can be determined. Such a delay time can guarantee that the time at which the current is the same as that at the beginning time can be detected in accordance with the sinusoidal current waveform of the audio signal frequency.

When a DC impedance detection circuit is applied in a class D audio amplifier, a ripple of switching frequency may be included in the current of the speaker. Because the switching frequency can be much greater than the audio frequency, when the speaker is operated in a higher frequency range, no resonant component may be included in the impedance curve. When the DC impedance detection circuit is applied in audio amplifiers of other types, speaker 3 may be operated in a lower frequency range; therefore, the resonant component can influence the detection of DC impedance. Also, filter circuits may be employed, in order to filter the current and voltage signals input to DC impedance detection circuit 5.

For example, the audio amplifier can include filter circuit 56 configured as a high pass filter or band stop filter of the voltage of the speaker, and filter circuit 57 configured as a high pass filter or band stop filter of the current of the speaker. Filter circuits 56 and 57 may have the same configuration, in order to guarantee that the amplitude attenuation ratio in the frequency domain is the same to protect the ratio between the voltage and current of speaker 3 from being influenced. For example, filter circuits 56 and 57 can be configured as Butterworth filters or Chebyshev filters. The audio amplifier can also include current integration circuit 52 configured to integrate the current of speaker 3 when integration time signal Q1 is active, in order to generate current integration signal Vc1.

Voltage integration circuit 53 can integrate the voltage of speaker 3 when integration time signal Q1 is active to generate voltage integration signal Vc2. During a time interval in which the current variation of the speaker is zero, the current and voltage of the speaker may be separately integrated, in order to generate the current integration signal and the voltage integration signal. The ratio between the voltage integration signal and the current integration signal can be calculated and configured as the DC impedance. In this way, the DC impedance can be detected in real time during speaker operation, in order to improve the detection accuracy.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:
1. A method of detecting a DC impedance of a speaker, the method comprising:
   a) generating a current integration signal by integrating a current of said speaker in an integration time interval;
   b) generating a voltage integration signal by integrating a voltage of said speaker in said integration time interval;
   c) generating a DC impedance of said speaker in said integration time interval by calculating a ratio between said voltage integration signal and said current integration signal; and
   d) said integration time interval being a time interval during operation of said speaker, wherein said current of said speaker at a beginning time of said integration time interval is the same as that at an ending time of said integration time interval.

2. The method of claim 1, wherein said integration time interval comprises at least one time at which said current of said speaker is the same as that at said beginning time.

3. The method of claim 1, wherein:
   a) said speaker is driven by a class D audio amplifier having a first and second half bridge switching circuits configured to provide first and second voltages to two terminals of said speaker; and
   b) said integration time interval comprises multiple switching periods of said class D audio amplifier.

4. The method of claim 3, further comprising:
   a) generating a current time parameter of said switching period by multiplying, in each switching period of said integration time interval, an average value of said current of said speaker at said beginning time of said switching period and said current of said speaker at said ending time of said switching period with a length of said switching period; and
   b) generating said current integration signal by summing each of said current time parameters of each of said switching periods in said integration time interval.

5. The method of claim 4, wherein said integrating said voltage of said speaker comprises:
   a) generating first, second, and third voltage time parameters, by multiplying, in each switching period of said integration time interval, said voltage of said speaker with lengths of first, second, and third time intervals;
   b) generating a voltage time parameter of said switching period by summing said first, second, and third voltage time parameters;
   c) wherein said first voltage is greater than said second voltage in said first time interval, said first voltage is the same as said second voltage in said second time interval, and said first voltage is less than said second voltage in said third time interval; and d) generating said voltage integration signal by summing each of said voltage time parameters of said switching periods in said integration time interval.

6. The method of claim 1, further comprising filtering said current and voltage of said speaker prior to said integrating said current and voltage of said speaker.

7. The method of claim 6, wherein said determining said integration time interval comprises:
   a) sampling said current of said speaker at said beginning time;
   b) after a delay time, detecting said current of said speaker, and comparing against said current at said beginning time; and
   c) configuring a time as said ending time of said integration time interval when said current of said speaker is the same as that at said beginning time.

8. A DC impedance detection circuit, comprising:
   a) an integration time generation circuit configured to generate an integration time signal in accordance with a current flowing through a speaker, wherein said current of a speaker at a beginning time of each active time interval of said integration time signal is the same as that at an ending time of said active time interval;
   b) a current integration circuit configured to integrate said current of said speaker in said active time interval, and to generate a current integration signal;
   c) a voltage integration circuit configured to integrate a voltage of said speaker in said active time interval, and to generate a voltage integration signal; and
   d) wherein a ratio between said voltage integration signal and said current integration signal is configured as a DC impedance of said speaker in said active time interval.

9. The DC impedance detection circuit of claim 8, further comprising a division circuit configured to calculate said ratio between said voltage and said current integration signals, and to generate said DC impedance of said speaker.

10. The DC impedance detection circuit of claim 8, further comprising a current sampling circuit configured to generate a sampling signal that represents said current of said speaker.

11. The DC impedance detection circuit of claim 10, said active time interval of said integration time signal comprises at least one time at which said current of said speaker is the same as that at said beginning time.

12. The DC impedance detection circuit of claim 11, wherein said integration time signal generation circuit comprises:
   a) an RS flip flop having a set terminal configured to receive a clock signal, a reset terminal configured to receive an output signal of an identity comparator, and an output terminal configured to provide said integration time signal;
   b) said identity comparator having a first input terminal configured to receive said sampling signal, and a second input terminal coupled to a first terminal of a sampling capacitor, wherein a second terminal of said sampling capacitor is coupled to ground;
   c) a sampling switch having a first terminal coupled to said first terminal of said sampling capacitor, and a second terminal configured to receive said sampling signal, wherein said sampling switch is controllable by said clock signal; and
   d) a shielding switch coupled between said output terminal of said identity comparator and said reset terminal.

13. The DC impedance detection circuit of claim 8, wherein said integration time generation circuit further comprises a delay trigger circuit configured to generate a clearing signal in accordance with said integration time signal, wherein said clearing signal is activated after a delay time has elapsed after said integration time signal goes inactive.

14. The DC impedance detection circuit of claim 13, wherein each of said current integration circuit and said voltage integration circuit comprises:
   a) an integration control switch coupled between a controllable current source and a first terminal of an integration capacitor having a second terminal coupled to ground; and
   b) a clearing control switch coupled in parallel with said integration control switch, wherein a voltage across said integration capacitor is configured as said current integration signal when said controllable current source is controlled by said current of said speaker in said current integration circuit, and wherein said voltage across said integration capacitor is configured as said voltage integration signal when said controllable current source is controlled by said voltage of said speaker in said voltage integration circuit.

15. The DC impedance detection circuit of claim 14, wherein each of said current integration circuit and said voltage integration circuit comprises an analog-to-digital converter configured to convert said current and voltage integration signals to corresponding digital signals.

16. The DC impedance detection circuit of claim 8, further comprising:
   a) a first filter circuit configured to filter said voltage of said speaker; and
   b) a second filter circuit configured to filter said current of said speaker, wherein said first and second filter circuits have a same configuration.

* * * * *